US010963105B2

(12) United States Patent
Lu et al.

(10) Patent No.: US 10,963,105 B2
(45) Date of Patent: Mar. 30, 2021

(54) IN-CELL TOUCH DISPLAY PANEL, MANUFACTURING METHOD THEREOF, DISPLAY DEVICE

(71) Applicant: BOE TECHNOLOGY GROUP CO., LTD., Beijing (CN)

(72) Inventors: Pengcheng Lu, Beijing (CN); Shengji Yang, Beijing (CN); Xiaochuan Chen, Beijing (CN); Minghua Xuan, Beijing (CN); Lei Wang, Beijing (CN); Jie Fu, Beijing (CN); Li Xiao, Beijing (CN); Jian Gao, Beijing (CN); Changfeng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 310 days.

(21) Appl. No.: 15/998,617

(22) PCT Filed: Dec. 12, 2017

(86) PCT No.: PCT/CN2017/115529
§ 371 (c)(1),
(2) Date: Aug. 16, 2018

(87) PCT Pub. No.: WO2018/205594
PCT Pub. Date: Nov. 15, 2018

(65) Prior Publication Data
US 2020/0333906 A1   Oct. 22, 2020

(30) Foreign Application Priority Data
May 12, 2017 (CN) .......................... 201710336082.0

(51) Int. Cl.
*G06F 3/041*  (2006.01)
*G06F 3/044*  (2006.01)
(Continued)

(52) U.S. Cl.
CPC ............ *G06F 3/044* (2013.01); *G06F 3/0412* (2013.01); *G06F 3/0446* (2019.05);
(Continued)

(58) Field of Classification Search
CPC .. G02F 1/1339; G02F 1/13394; G02F 1/1343; G02F 1/136209; G02F 2201/121;
(Continued)

(56) References Cited

U.S. PATENT DOCUMENTS

2009/0174835 A1\* 7/2009 Lee .................. G02F 1/133512
349/46
2010/0231843 A1\* 9/2010 Tadaki .............. G02F 1/133377
349/156
(Continued)

FOREIGN PATENT DOCUMENTS

CN    104461209    \*  3/2015  ............. G06F 3/041
CN    104503633 A  \*  4/2015  ............. G06F 3/041
(Continued)

OTHER PUBLICATIONS

Search Report and Written Opinion for International Application No. PCT/CN2017/115529 dated Mar. 9, 2018.
(Continued)

*Primary Examiner* — Michael J Eurice
(74) *Attorney, Agent, or Firm* — Calfee, Halter & Griswold LLP

(57) ABSTRACT

An in-cell touch display panel, a manufacturing method thereof, and a display device. The in-cell touch display panel includes a base substrate, a touch electrode, and a touch driver chip. The touch electrode includes a plurality of sub-electrodes that are independent from each other. The display panel further includes a plurality of touch leads that are in one-to-one correspondence with the sub-electrodes. Each of the sub-electrodes is connected to the touch driver
(Continued)

chip through a corresponding touch lead. At least one sub-electrode has at least one non-conductive region, and an orthographic projection of the non-conductive region of the sub-electrode and that of the touch lead corresponding to the sub-electrode on the base substrate at least partially overlap.

17 Claims, 5 Drawing Sheets

(51) Int. Cl.
    *G06F 3/047*     (2006.01)
    *H01L 27/32*     (2006.01)
    *H01L 51/52*     (2006.01)
    *H01L 51/56*     (2006.01)

(52) U.S. Cl.
    CPC ........ *H01L 27/323* (2013.01); *H01L 27/3244* (2013.01); *H01L 51/5221* (2013.01); *H01L 51/56* (2013.01); *G06F 2203/04103* (2013.01); *G06F 2203/04111* (2013.01); *H01L 2227/323* (2013.01)

(58) Field of Classification Search
    CPC .. G02F 2201/123; G06F 3/041; G06F 3/0412; G06F 3/0416; G06F 3/04166; G06F 3/044; G06F 3/0443; G06F 3/0445; G06F 3/0446; G06F 3/047; G06F 2203/04103; G06F 2203/04111; G06F 2203/04112; G09G 3/3655; G09G 2300/0426; H01L 27/323; H01L 27/3244; H01L 51/56; H01L 51/5221; H01L 2227/323
    See application file for complete search history.

(56) References Cited

U.S. PATENT DOCUMENTS

| | | | | |
|---|---|---|---|---|
| 2014/0306916 | A1* | 10/2014 | Wang | G06F 3/0412 345/173 |
| 2015/0124310 | A1* | 5/2015 | Figura | G02B 26/005 359/290 |
| 2016/0085374 | A1* | 3/2016 | Ma | G06F 3/044 345/174 |
| 2016/0110008 | A1 | 4/2016 | Lee et al. | |
| 2016/0139719 | A1* | 5/2016 | Liu | G06F 3/044 345/174 |
| 2016/0216546 | A1* | 7/2016 | Kim | G02F 1/13394 |
| 2016/0313831 | A1 | 10/2016 | Lin | |
| 2016/0357283 | A1* | 12/2016 | Xu | G02F 1/133512 |
| 2016/0357308 | A1* | 12/2016 | Li | G02F 1/133512 |
| 2017/0261849 | A1* | 9/2017 | Tang | G02F 1/133512 |
| 2017/0322650 | A1 | 11/2017 | Liu et al. | |
| 2018/0143717 | A1* | 5/2018 | An | G06F 3/044 |

FOREIGN PATENT DOCUMENTS

| | | |
|---|---|---|
| CN | 105094422 A | 11/2015 |
| CN | 105528125 A | 4/2016 |
| CN | 106354302 A | 1/2017 |
| CN | 107168578 A | 9/2017 |

OTHER PUBLICATIONS

First Office Action for Chinese Patent Application No. 201710336082.0 dated Jun. 29, 2018.

\* cited by examiner

IN-CELL TOUCH DISPLAY PANEL, MANUFACTURING METHOD THEREOF, DISPLAY DEVICE

RELATED APPLICATION

The present application is the U.S. national phase entry of PCT/CN2017/115529, with an international filling date of Dec. 12, 2017, which claims the benefit of Chinese Patent Application No. 201710336082.0, filed on May 12, 2017, the entire disclosure of which is incorporated herein by reference.

TECHNICAL FIELD

The present disclosure relates to the field of touch display technology, and more specifically to an in-cell touch display panel, a manufacturing method thereof, and a display device.

BACKGROUND

With the rapid development of display technologies, the touch display technology has been widely used in various display products such as mobile phones, watches, tablet computers, and the like. Organic light emitting diode (OLED) display products have represented current development trend due to their characteristics such as wide viewing angle, low energy consumption, thinness, etc.

Regarding the touch screen technology, capacitive touch screens have advantages such as long service life, high light transmittance, multi-touch support, and so on, as compared to resistive touch screens. In addition, capacitive touch screens have a good suppression effect on noise and parasitic capacitance to ground. Therefore, capacitive touch screens have become the mainstream in the field of touch screens.

The projection-type capacitive touch screen technology realizes touch function using changes in capacitance generated when a finger touches a touch panel. Projection-type capacitance touch screens can be classified into self-capacitive touch screens and mutual-capacitive touch screens in terms of their operating principles. Self-capacitive touch screens and mutual-capacitive touch screens realize detection of a finger-touched position based on the principles of self-capacitance and mutual capacitance, respectively. In terms of structure of the touch module, the projection-type capacitance touch screens may be classified into out-cell type and built-in type. In-cell capacitance touch screens integrate a touch electrode within the display screen, which have advantages such as simple structure, lightness, thinness, and low cost, and are increasingly becoming the mainstream technology for touch screens. For example, they are more and more widely used in various portable intelligent terminals (such as mobile phones).

Built-in capacitance touch screens can be classified into on-cell touch screens and in-cell touch screens. In-cell touch screens can be further classified into hybrid in-cell (HIC) capacitance touch screens and full in-cell (FIC) capacitance touch screens.

SUMMARY

According to an exemplary embodiment of the disclosure, there is provided an in-cell touch display panel including a base substrate, a touch electrode, and a touch driver chip. The touch electrode includes a plurality of sub-electrodes independent from each other. The display panel further includes a plurality of touch leads that are in one-to-one correspondence with the sub-electrodes, and each of the sub-electrodes is connected to the touch driver chip through a corresponding touch lead. At least one sub-electrode has at least one non-conductive region, and an orthographic projection of the non-conductive region of the sub-electrode and that of a touch lead corresponding to the sub-electrode on the base substrate at least partially overlap.

In some exemplary embodiments, the in-cell touch display panel is an OLED display panel, and the touch electrode is reused as an OLED cathode of the OLED display panel.

In some exemplary embodiments, the touch leads are used to transmit a display driving signal to the touch electrode in a display phase, transmit a touch scanning signal to the touch electrode in a touch phase, and transmit a touch signal generated by the touch electrode to the touch driver chip.

In some exemplary embodiments, the plurality of sub-electrodes are arranged in a matrix, and each sub-electrode is a square electrode block.

In some exemplary embodiments, a barrier is used to separate adjacent sub-electrodes.

In some exemplary embodiments, a material of the barrier further forms the at least one non-conductive region.

In some exemplary embodiments, a cross section of the barrier has an inverted trapezoidal shape.

In some exemplary embodiments, the barrier is made of a negative photoresist material.

In some exemplary embodiments, the non-conductive region is a via hole in the sub-electrode or is filled with a non-conductive material.

According to another exemplary embodiment of the disclosure, there is provided a display device including the in-cell touch display panel described in any of the foregoing embodiments.

The disclosure further provides a method for manufacturing the in-cell touch display panel as described in the foregoing embodiments, including: forming the plurality of touch leads in a pixel area of a base substrate; forming a barrier on the base substrate on which the pixel area is formed; and forming the plurality of sub-electrodes by evaporating a touch electrode material on the base substrate on which the barrier is formed.

It is to be understood that both the foregoing general description and the following detailed description are exemplary and explanatory only and do not limit the disclosure.

BRIEF DESCRIPTION OF DRAWINGS

The drawings herein are incorporated into the specification and constitute a part of this specification, and serve to explain the principle of the disclosure together with the specification. The drawings mentioned in the description below are merely some embodiments of the disclosure. Other drawings can be further obtained by those ordinarily skilled in the art based on these drawings without inventive efforts.

DETAILED DESCRIPTION OF EMBODIMENTS

Figure 1:
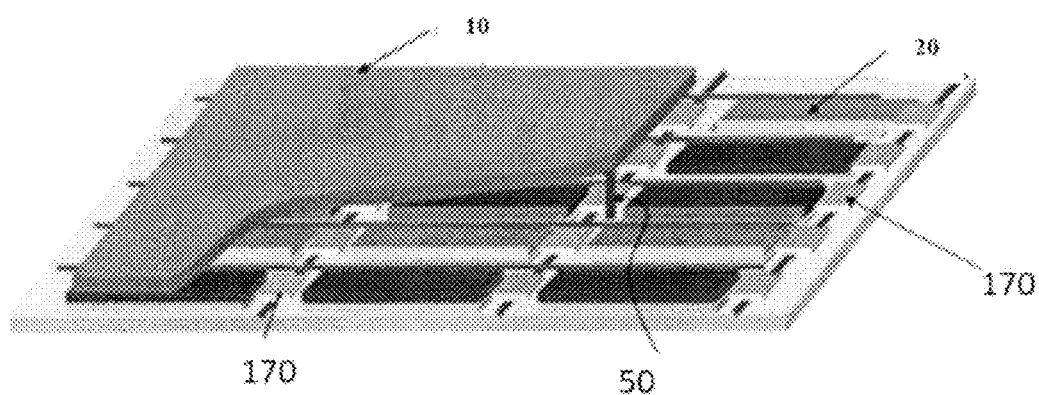
FIG. 1 and FIG. 2 are schematic diagrams illustrating partial structures of an in-cell touch display panel.

Exemplary embodiments of the present disclosure will now be described more fully with reference to the accompanying drawings. However, the embodiments of the disclosure can be implemented in various forms, and should not be construed as being limited to the examples set forth herein. The features, structures, or characteristics described may be combined in any suitable manner in one or more embodiments. In the description below, numerous specific details are provided to provide a thorough understanding to the embodiments of the disclosure. However, those skilled in the art will recognize that one or more of the specific details may be omitted, or other methods, elements, devices, steps, etc. may be employed in practicing the technical solutions provided by the embodiments of the present disclosure.

It is to be noted that in the drawings, the dimensions of layers and regions may be exaggerated for clarity of illustration. It may also be understood that when an element or layer is referred to as being "above" another element or layer, it may be directly on the other element, or there may be an intermediate layer. In addition, it may be understood that when an element or layer is referred to as being "under/below" another element or layer, it can be directly under the other element, or there may be more than one intermediate layer or element. Furthermore, it may also be understood that when a layer or element is referred to as being "between" two layers or two elements, it can be the sole layer between two layers or two elements, or there may be more than one other intermediate layer or element. Similar reference numerals denote similar elements throughout the specification.

Figure 2:
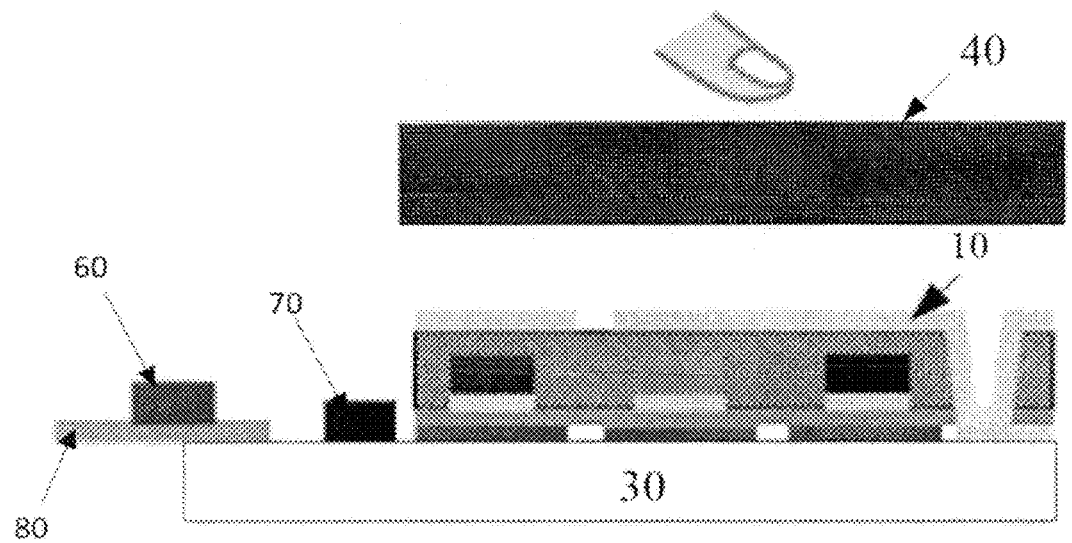

The main structure of an in-cell self-capacitance display panel will be briefly described below by taking an OLED panel as an example. As shown in FIGS. 1 and 2, the array substrate of the in-cell self-capacitance OLED panel may include a glass substrate 30, an array of pixels 20, and a touch electrode 10, and may further include a touch driver IC (TIC) 60, a display driver IC (DDI) 70, a flexible printed circuit (FPC) 80, etc. The touch electrode 10 may be connected to the touch driver IC through a touch pattern metal (TPM) 50 so as to detect the touch position and/or the magnitude of touch pressure.

Since organic materials and metals are quite sensitive to oxygen and moisture, after the array substrate is completed, it needs to be protected by packaging. As shown in FIG. 2, a package cover plate 40 is provided to protect the completed array substrate.

For a self-capacitance OLED panel, the cathode of the OLED can be reused as a touch electrode. That is, the touch electrode 10 in FIGS. 1 and 2 also serves as the cathode of the OLED. For example, the touch electrode 10 may be divided into different blocks, and a time-divisional driving scheme may be applied to the OLED panel. During a display phase, the electrode 10 functions as the cathode of the OLED element and forms a voltage difference with an anode of the pixel, enabling the OLED to emit light. In the touch phase, the electrode 10 functions as the touch electrode to detect the touch operation.

Figure 3:
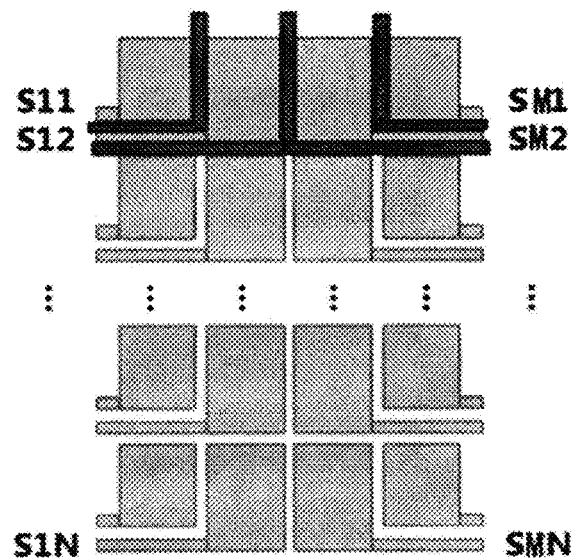
FIG. 3 shows a schematic diagram of a cathode pattern of an in-cell touch display panel.

FIG. 3 shows a schematic diagram of a touch electrode/cathode pattern in an in-cell touch display paterminalnel. As shown in FIG. 3, multiple cathode blocks can be obtained using spacers, e.g., S11, S12 . . . S1N, S21, S22 . . . S2N, SM1, SM2 . . . SMN, etc., each of M and N is a positive integer greater than or equal to 1.

However, inventors of the disclosure have found that a problem with this solution lies in that each cathode block is connected to a terminal of an integrated circuit (IC) chip (for example, a touch driver chip, or an integrated chip of a touch driver chip and a display driving chip) through a metal material, but the distances from various cathode blocks to the IC chip are different. This leads to greatly different line impedances between the IC chip and different cathode blocks, so that different voltage drops (IR drop) occur between different cathode blocks and the IC chip, thereby affecting the uniformity of the touch effect.

Figure 4:
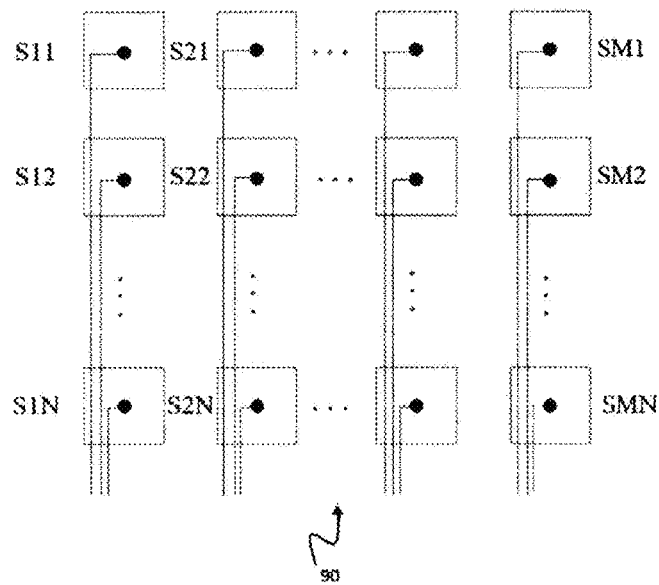
FIG. 4 shows a schematic diagram of a cathode pattern structure of another in-cell touch display panel.

In order to improve the defects caused by the above voltage drops, each cathode block may be connected to the IC chip through a metal wire. As shown in FIG. 4, each cathode block is connected to the terminal 90 of the IC chip by one metal wire. However, the inventors have found that a problem with this solution is that one metal wire may pass through multiple cathode blocks simultaneously. That is, multiple metal wires may be present below each cathode block at the same time (for example, three metal wires are present below the cathode block S1N in FIG. 4). If one metal wire passes through different cathode blocks, the metal wire will affect the capacitance of corresponding cathode blocks, thereby affecting the signal detection for finger touch and influencing the signal-to-noise ratio of a detection signal.

Therefore, inventors of the disclosure propose another solution. An in-cell touch display panel according to an embodiment of the present disclosure includes a base substrate, a touch electrode, and a touch driver chip. The touch electrode includes a plurality of sub-electrodes independent from each other. The in-cell touch display panel further includes touch leads (e.g. metal wires) in one-to-one correspondence with the plurality of sub-electrodes, and each sub-electrode is connected to the touch driver chip through a corresponding touch lead. At least one sub-electrode has at least one non-conductive region, and an orthographic projection of the non-conductive region of the sub-electrode on the base substrate at least partially overlaps that of the touch lead corresponding to the sub-electrode on the base substrate.

The pixel area of the array substrate may include a plurality of pixel units arranged in a matrix. Each pixel unit includes at least three sub-pixel units. Each sub-pixel unit includes a thin film transistor 170. The thin film transistor includes a gate, a gate insulating layer, an active layer, a source and a drain, etc.

In the embodiment of the present disclosure, each sub-electrode is electrically connected to the touch driver chip through a corresponding touch lead. Therefore, upon implementation, in the in-cell type touch display panel provided by this embodiment, the respective touch leads are in one-to-one correspondence with the respective sub-electrodes. Each sub-electrode is electrically connected to the touch driver chip through a corresponding touch lead. In this way, the electrical connection between each sub-electrode and the touch driver chip is realized.

A capacitance C of a capacitor formed by a sub-electrode in the touch electrode and a touch lead can be represented as the following formula: $C = \varepsilon S / 4\pi k d$, where $\varepsilon$ is the dielectric constant of an insulating dielectric medium, S represents an area of a portion of one of the sub-electrode and the touch lead that is directly opposite to the other of the sub-electrode and the touch lead, which may be referred to as an opposing area, k is the electrostatic constant, and d is the distance between the sub-electrode and the touch lead. In the embodiment of the disclosure, a non-conductive region is disposed in the sub-electrode, and an orthographic projection of the non-conductive region and that of the touch electrode corresponding to the sub-electrode on the base substrate at least partially overlap. As a result, the opposing area S of the capacitor formed by the sub-electrode and corresponding touch lead can be reduced, so that the capacitance of this capacitor can be decreased, which increases the signal-to-noise ratio of the in-cell touch display panel upon touch and enhances the accuracy of touch detection.

The in-cell touch display panel provided by an embodiment of the present disclosure will be described in detail below with reference to FIGS. 5 and 6.

Figure 5:
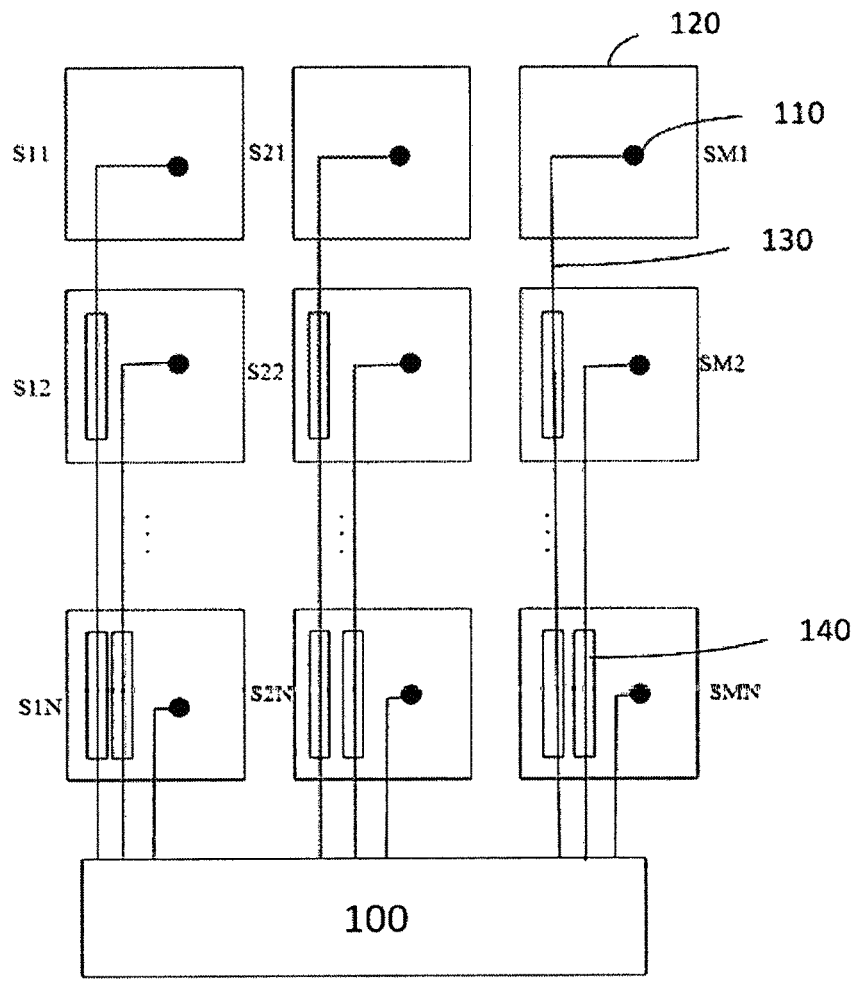
FIG. 5 shows a schematic diagram of touch electrodes and touch leads in an in-cell touch display panel provided by an exemplary embodiment of the present disclosure.

FIG. 5 shows a schematic diagram of an in-cell touch display panel provided by an embodiment of the present disclosure.

The previously mentioned HIC capacitive touch screen is generally based on a double-layer touch lead and the mutual-capacitance principle, while the FIC capacitive touch screen is based on a single-layer touch lead design and the self-capacitance principle to realize multi-touch. That is, the HIC capacitive touch screen requires two layers of touch leads, while the touch leads of the FIC capacitive touch screen are collected in one layer. In the following embodiments, the single-layer touch leads of the FIC capacitive touch screen are used as an example for illustration, but the disclosure is not so limited. The principle of the disclosure is also applicable to the HIC capacitive touch screen with double-layer touch leads. Touch screens, which apply the technical principle of reducing the capacitance of the capacitor formed by the sub-electrode and corresponding touch lead by providing a non-conductive region in the sub-electrode as proposed by the solution in the embodiments of the disclosure, will fall within the protection scope of the disclosure.

In an embodiment, the in-cell touch display panel is an OLED display panel including an OLED cathode. The touch electrode may be reused as the OLED cathode. However, the disclosure is not so limited. In other embodiments, the in-cell touch display panel may be any other type of display panel such as a LCD display panel. Correspondingly, the touch electrode may be reused as a common electrode.

The basic structure of an OLED is a sandwich structure including an anode (e.g. thin and transparent indium tin oxide ITO) and a metal cathode. The entire structure of the OLED further includes a hole transport layer, a emitting material layer (EL), and an electron transport layer. When an appropriate voltage is applied between the anode and the cathode, holes at the anode and electrons at the cathode are combined in the emitting material layer to produce light. Red, green, and blue (RGB) primary colors are generated according to the material of the emitting material layer to form basic colors. Upon displaying, a DC voltage is applied to the cathode, and a grayscale voltage signal is applied to the anode at the same time, so that the luminance can be controlled, thereby realizing display of the OLED.

In order to increase the luminous efficiency of the light emitting element, metals having low work function such as Ag, Al, Ca, In, Li, and Mg, or composite metals having low work function (e.g. Mg—Ag) may be used to make the cathode.

In an exemplary embodiment, the touch lead is used to transmit a display driving signal to the touch electrode in the display phase, transmit a touch scanning signal to the touch electrode in the touch phase, and transmit a touch signal generated by the touch electrode at a touch position to the touch driver chip.

Since the touch electrode is composed of a plurality of sub-electrodes, in order to reduce mutual interferences between displaying and touch, a way of time sharing driving may be employed. Moreover, in practice, a display driving chip for displaying and the touch driver chip may be integrated into one chip, which can further reduce the production cost.

Herein, the display phase refers to a time period for realizing an image display function in the case that the array substrate is applied to the touch display panel, and the touch phase refers to a time period for realizing a touch function in the case that the array substrate is applied to the touch display panel. During a specific operation, a time sharing driving method is used to drive the sub-electrodes (i.e. driving of the sub-electrodes during the display phase is independent from driving during the touch phase). For example, in the display phase, the sub-electrodes are used as OLED cathodes, and a corresponding voltage for realizing an image display function is applied to the sub-electrodes and OLED anodes, thereby realizing the image display function; in the touch phase, the sub-electrodes are used as touch electrodes, and a corresponding voltage for realizing a touch function is applied to the sub-electrodes, while OLED anodes do not work so as not to affect the touch.

In the embodiment shown in FIG. 5, the plurality of sub-electrodes are arranged in a matrix, and each sub-electrode is a square electrode block. However, the disclosure is not so limited, and each sub-electrode may have any other shape. For example, it may also be a stripe electrode.

The sub-electrodes may have a rectangular shape, for example, squares of the same size as shown in FIG. 5. A sub-electrode may correspond to multiple pixel units. However, the disclosure is not so limited. The sub-electrodes may have the same shape or different shapes, and may have the same area or different areas. In case the sub-electrodes have the same shape and size, it is more advantageous to the uniformity of touch when a finger touches.

In an exemplary embodiment, the touch leads are in the same layer as the source, drain or gate of the thin film transistor in the pixel area of the in-cell touch display panel. In another embodiment, the in-cell touch display panel further includes a plurality of abutments (insulating layers) in one-to-one correspondence with the sub-electrodes. The abutments are provided with via holes through which the sub-electrodes are connected to corresponding touch leads. By arranging the abutments in one-to-one correspondence with the sub-electrodes on the layer structure where the touch leads reside, it is convenient to implement the via-hole process at the abutments, which helps to achieve good electrical connections between the sub-electrodes and the touch leads.

It is to be noted that although the via hole 110 depicted in FIG. 5 is circular, the disclosure is not so limited, and the via hole may have an arbitrary shape.

When the array substrate is applied to the in-cell touch display panel, the size of the sub-electrode varies with the size of the in-cell touch display panel, which is not limited here. Generally, for a touch display panel with a size of 6 inches or less, the side length of a square sub-electrode may be between 3.5-5 mm.

It is to be noted that, at the time of manufacturing the above in-cell touch display panel, those skilled in the art can determine the number of sub-electrodes according to the area of the pixel area and the actually required density of touch electrodes. The specific number of sub-electrodes is not limited in the embodiments of the disclosure.

In the embodiment shown in FIG. 5, a single sub-electrode 120 may be a square electrode block of about 5 mm×5 mm. The sub-electrode may be connected to the touch driver chip 100 through a touch lead 130, a driving signal is applied to the sub-electrode by the touch driver chip, and the sub-electrode 120 can provide a feedback signal to the touch driver chip. When the finger does not touch the display panel, the capacitance for the sub-electrode 120 is a fixed value. When the finger touches the display panel, the capacitance for the sub-electrode 120 is a finger capacitance plus the original capacitance. Due to different magnitudes of the capacitances, RC (resistance capacitance delay) delay in the signal occurs at different times. In this way, before and after the touch of the finger, the touch driver chip will receive different electrical signals, thereby determining a touch point. Continuing to refer to FIG. 5, in some embodiments, a non-conductive region 140 (e.g. opening) is disposed in the portion of the metal touch lead exactly opposite to the sub-electrode, e.g., the region of the sub-electrode exactly opposite to the metal touch lead is at least partially hollowed or filled with a non-conductive material, and the formed non-conductive region will not affect the capacitance of the sub-electrode, thereby increasing the signal-to-noise ratio for the touch signal while enhancing the accuracy of the touch detection.

It is to be noted that, although the non-conductive region 140 in FIG. 5 is in a rectangle shape, no limitation is made in this regard in the disclosure, and the non-conductive region 140 may have any shape. In addition, although the non-conductive regions 140 in FIG. 5 are rectangles of the same shape and the same size, the disclosure is not so limited, and the non-conductive regions 140 may have different shapes and different sizes. Furthermore, in order to clearly show the non-conductive region 140, FIG. 5 intentionally depicts a large non-conductive region 140, but in practical disclosures, it is only required to make the orthographic projection of the non-conductive region 140 on the base substrate at least partially overlap the orthographic projection of the sub-electrode on the base substrate.

In other embodiments, the non-conductive region 140 may be in a more elongated shape than in the embodiment shown in FIG. 5, so that the region of the sub-electrode exactly opposite to the touch lead is substantially set as a non-conductive region completely. Since the region of the sub-electrode exactly opposite to the touch electrode is almost completely a non-conductive region, the capacitance of the capacitor formed by the sub-electrode and the touch electrode can be reduced to a maximum extent, which is more advantageous to increasing the signal-to-noise ratio of touch and enhancing accuracy in touch control.

Figure 6:
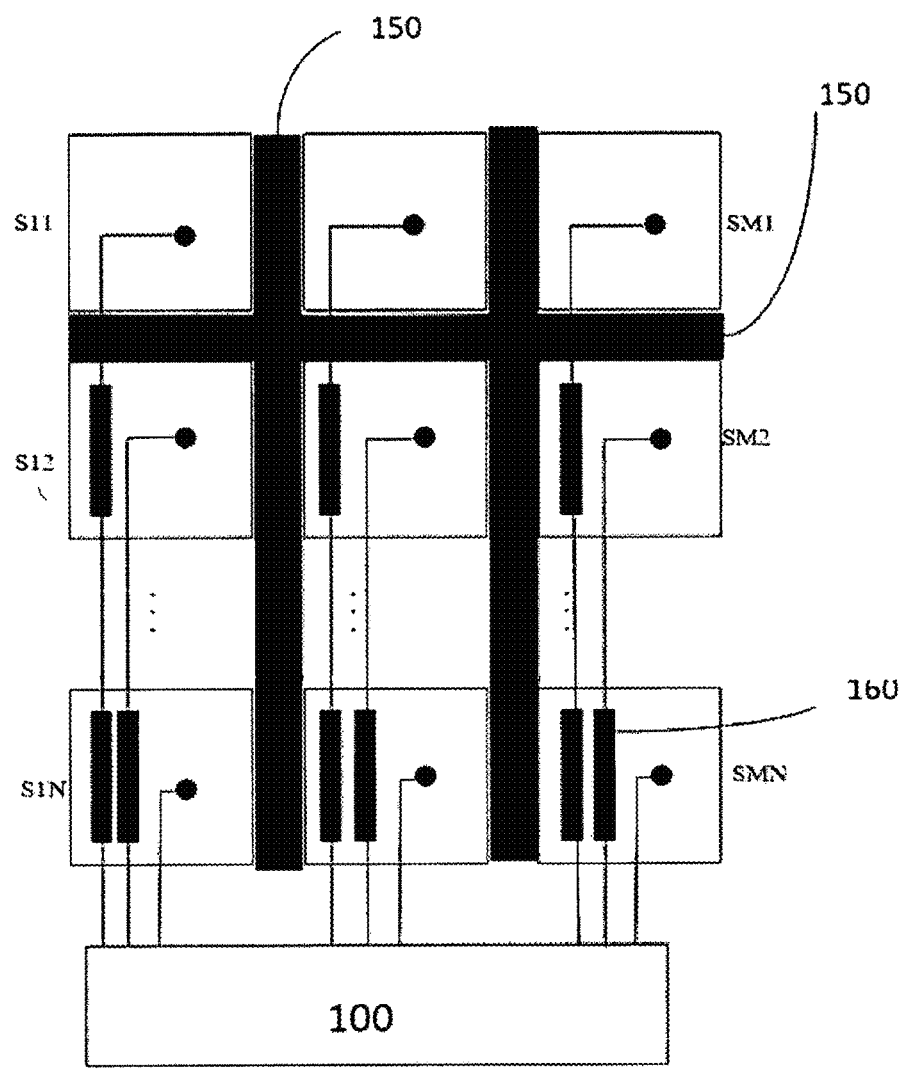
FIG. 6 shows a schematic diagram of touch electrodes and touch leads in an in-cell touch display panel provided by another exemplary embodiment of the present disclosure.

FIG. 6 shows a schematic diagram of an in-cell touch display panel provided by another exemplary embodiment of the present disclosure.

In the exemplary embodiment, the in-cell display panel further includes a barrier (e.g. 150 shown in FIG. 6), and the barrier 150 is used to separate adjacent sub-electrodes.

In the exemplary embodiment, the material of the barrier further forms at least one non-conductive region (e.g. 160 shown in FIG. 6).

In an exemplary embodiment, the cross section of the barrier has an inverted trapezoidal shape, that is, the cross section of the barrier is a trapezoid whose upper edge is larger than its lower edge. With the barrier having a cross section in an inverted trapezoidal shape, it is possible to evaporate an electrode material film layer directly on the array substrate, and adjacent sub-electrodes can be separated by the barrier, the sub-electrode and the non-conductive region within the sub-electrode can be separated by the barrier, so that the sub-electrode structure can be fabricated by one-time evaporation process. Therefore, the embodiment of the present disclosure can further simplify the manufacturing process of the in-cell type touch display panel.

In an exemplary embodiment, the barrier is made of a negative photoresist material. When the organic emitting material layer and the cathode are formed by evaporation, the barrier made of a negative photoresist material can isolate the cathode, thereby forming a pattern required by the touch electrode.

In the embodiment of the disclosure, by reducing the area of the region of the sub-electrode exactly opposite to the touch lead, the capacitance of the plate capacitor formed by the sub-electrode and the touch lead is further reduced, thereby improving the precision of the touch signal. During cathode evaporation, the region of the cathode exactly opposite to the touch lead is hollowed to form holes, or filled with a non-conductive material. As a result, the capacitance touch for the sub-electrode is less affected by the metal touch lead, thereby increasing the signal-to-noise ratio of the touch signal, and enhancing the accuracy of touch detection.

The above are merely examples of a self-capacitance in-cell touch display panel structure. In actual production and application, the specific structure of the display panel is not so limited. The film layer structures thereof may be increased and decreased or changed according to actual production requirements so as to adapt to various display panels, which is not limited herein.

Further, another embodiment of the present disclosure provides a display device including the in-cell touch display panel described in the above embodiment of the disclosure.

The display device may be any product or component having a display function such as a mobile phone, a tablet computer, a television, a monitor, a notebook computer, a digital photo frame, a navigator, and the like. Other indispensable components for the display device are known to those of ordinarily skilled in the art, and will not be described in detail herein, which should not be taken as limiting the disclosure.

Figure 7:
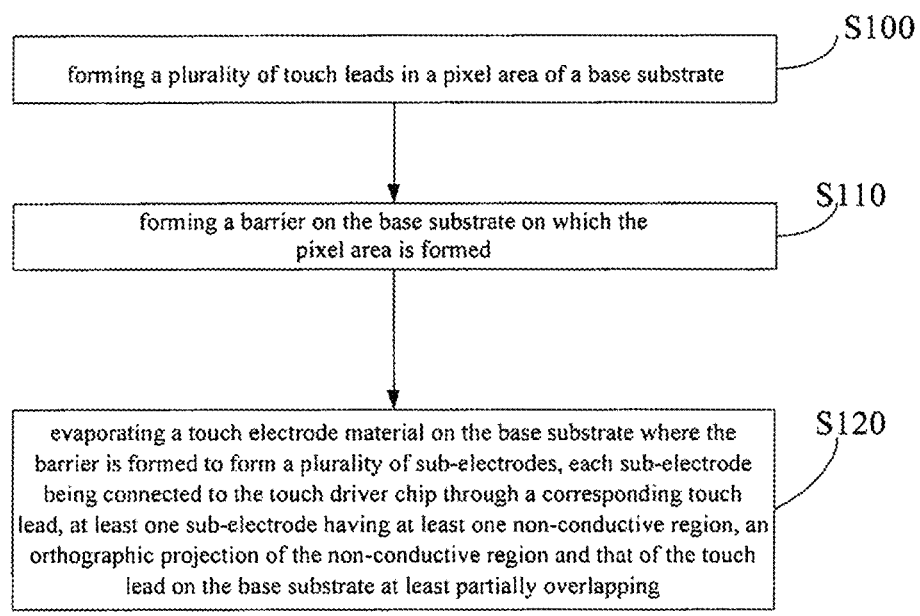
FIG. 7 shows a flowchart of a method for manufacturing an in-cell touch display panel provided by an exemplary embodiment of the present disclosure.

FIG. 7 shows a flowchart of a method for manufacturing an in-cell touch display panel provided by an exemplary embodiment of the disclosure.

As shown in FIG. 7, the method for manufacturing an in-cell touch display panel in the above embodiment may include the following steps.

In step S100, a plurality of touch leads are formed in a pixel area of a base substrate.

In step S110, a barrier is formed on the base substrate on which the pixel area is formed.

In an exemplary embodiment, step S110 may include forming a negative photoresist layer on the pixel area of the base substrate; disposing a mask plate over the negative photoresist layer and exposing the negative photoresist; and developing the exposed negative photoresist film layer to form a barrier.

It is possible to make the cross section of the obtained barrier become an inverted trapezoid whose upper edge is larger than its lower edge by means of scattering of light during exposure.

In step S120, a touch electrode material layer is formed by evaporation on the base substrate where the barrier is formed to form a plurality of sub-electrodes.

Each of the sub-electrodes is connected to the touch driver chip through a corresponding touch lead. At least one sub-electrode has at least one non-conductive region, and an orthographic projection of the non-conductive region and that of the touch lead on the base substrate at least partially overlap.

Since the cross section of the barrier is an inverted trapezoid whose upper edge is larger than its lower edge, the barrier can automatically separate adjacent sub-electrodes during the evaporation process and separate the sub-electrode from the non-conductive region to form a sub-electrode having a non-conductive region. In the above embodiment, each sub-electrode and its non-conductive region can be formed by one-time evaporation process, thus this embodiment can simplify the manufacturing process of the in-cell type touch display panel.

In addition, the specific details of the steps in the method for manufacturing an in-cell touch display panel above have been described in detail in the corresponding in-cell touch display panel, and therefore will not be described here. Moreover, although various steps of the method in the disclosure have been described in the drawings in a particular order, this does not require or imply that the steps must be performed in this particular order, or that all illustrated steps must be performed to achieve the desired result. In other embodiments, some steps may be omitted, multiple steps may be combined into one step, and/or one step may be decomposed into multiple steps for execution.

Those skilled in the art will readily conceive of other alternative embodiments after considering the specification and practicing the disclosure herein. The present invention is intended to cover any variations, usages, or adaptations of the present disclosure which follow general principles of the present disclosure and include common knowledge or conventional techniques in this technical field not disclosed herein. The description and embodiments are only considered to be exemplary, with the scope and spirit of the disclosure being indicated by the appended claims.

The invention claimed is:

1. An in-cell touch display panel comprising a base substrate, a touch electrode, and a touch driver chip,
wherein the touch electrode includes a plurality of sub-electrodes independent from each other, the display panel further comprises a plurality of touch leads that are in one-to-one correspondence with the plurality of sub-electrodes, each of the plurality of sub-electrodes is connected to the touch driver chip through a corresponding touch lead,
wherein at least one sub-electrode has at least one non-conductive region, and an orthographic projection of the non-conductive region of the sub-electrode on the base substrate and that of the touch lead corresponding to the sub-electrode on the base substrate at least partially overlap,
wherein the in-cell touch display panel is an OLED display panel, and the touch electrode is reused as an OLED cathode of the OLED display panel, and
wherein the in-cell touch display panel further comprises a barrier, which is used to separate adjacent sub-electrodes.

2. The in-cell touch display panel according to claim 1, wherein the touch leads are used to transmit a display driving signal to the touch electrode in a display phase, transmit a touch scanning signal to the touch electrode in a touch phase, and transmit a touch signal generated by the touch electrode to the touch driver chip.

3. The in-cell touch display panel according to claim 1, wherein the plurality of sub-electrodes are arranged in a matrix, and each sub-electrode is a square electrode block.

4. The in-cell touch display panel according to claim 1, wherein a material of the barrier further forms the at least one non-conductive region.

5. The in-cell touch display panel according to claim 1, wherein a cross section of the barrier has an inverted trapezoidal shape.

6. The in-cell touch display panel according to claim 1, wherein the barrier is made of a negative photoresist material.

7. The in-cell touch display panel according to claim 1, wherein the non-conductive region is a via hole in the sub-electrode or is filled with a non-conductive material.

8. A display device comprising a base substrate, a touch electrode, and a touch driver chip,
wherein the touch electrode includes a plurality of sub-electrodes independent from each other, the display panel further comprises a plurality of touch leads that are in one-to-one correspondence with the plurality of sub-electrodes, each of the plurality of sub-electrodes is connected to the touch driver chip through a corresponding touch lead,
wherein at least one sub-electrode has at least one non-conductive region, and an orthographic projection of the non-conductive region of the sub-electrode on the base substrate and that of the touch lead corresponding to the sub-electrode on the base substrate at least partially overlap,
wherein the in-cell touch display panel is an OLED display panel, and the touch electrode is reused as an OLED cathode of the OLED display panel, and
wherein the in-cell touch display panel further comprises a barrier, which is used to separate adjacent sub-electrodes.

9. The display device according to claim 8, wherein the in-cell touch display panel is an OLED display panel, and the plurality of touch electrode is reused as an OLED cathode of the OLED display panel.

10. The display device according to claim 8, wherein the touch leads are used to transmit a display driving signal to the touch electrode in a display phase, transmit a touch scanning signal to the touch electrode in a touch phase, and transmit a touch signal generated by the touch electrode to the touch driver chip.

11. The display device according to claim 8, wherein the plurality of sub-electrodes are arranged in a matrix, and each sub-electrode is a square electrode block.

12. The display device according to claim 8, wherein the non-conductive region is a via hole in the sub-electrode or is filled with a non-conductive material.

13. The display device according to claim 8, wherein the in-cell display panel further comprises a barrier, which is used to separate adjacent sub-electrodes.

14. The display device according to claim 13, wherein a material of the barrier further forms the at least one non-conductive region.

15. The display device according to claim 13, wherein a cross section of the barrier has an inverted trapezoidal shape.

16. The display device according to claim 13, wherein the barrier is made of a negative photoresist material.

17. A method for manufacturing an in-cell touch display panel, the in-cell touch display panel comprising a base substrate, a touch electrode, and a touch driver chip,
wherein the touch electrode includes a plurality of sub-electrodes independent from each other, the display panel further comprises a plurality of touch leads that are in one-to-one correspondence with the plurality of sub-electrodes, each of the plurality of sub-electrodes is connected to the touch driver chip through a corresponding touch lead, wherein at least one sub-electrode has at least one non-conductive region, and an orthographic projection of the non-conductive region of the sub-electrode on the base substrate and that of the touch lead corresponding to the sub-electrode on the base substrate at least partially overlap, wherein the in-cell touch display panel is an OLED display panel, and the touch electrode is reused as an OLED cathode of the OLED display panel, and wherein the in-cell touch display panel further comprises a barrier, which is used to separate adjacent sub-electrodes, the method comprising:

forming the plurality of touch leads in a pixel area of the base substrate;

forming a barrier on the base substrate on which the pixel area is formed; and forming the plurality of sub-electrodes by evaporating a touch electrode material on the base substrate on which the barrier is formed.

* * * * *